United States Patent
Su et al.

(10) Patent No.: US 9,219,457 B2
(45) Date of Patent: Dec. 22, 2015

(54) RECEIVER DEVICE AND METHOD FOR CONTROLLING AMPLIFICATION FACTOR THEREOF

(71) Applicant: REALTEK SEMICONDUCTOR CORP., Hsinchu (TW)

(72) Inventors: Ching-Yao Su, Hsinchu (TW); Liang-Wei Huang, Hsinchu (TW); Sheng-Fu Chuang, Hsinchu (TW); Hsuan-Ting Ho, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 14/572,340

(22) Filed: Dec. 16, 2014

(65) Prior Publication Data

US 2015/0171810 A1 Jun. 18, 2015

(30) Foreign Application Priority Data

Dec. 18, 2013 (TW) .............................. 102146869 A

(51) Int. Cl.
*H03G 3/00* (2006.01)
*H03G 3/20* (2006.01)
*H04M 11/06* (2006.01)

(52) U.S. Cl.
CPC ................. *H03G 3/002* (2013.01); *H03G 3/20* (2013.01); *H04M 11/06* (2013.01)

(58) Field of Classification Search
None
See application file for complete search history.

(56) References Cited

U.S. PATENT DOCUMENTS

| 6,519,069 | B1 | 2/2003 | Evans et al. |
| 7,502,951 | B2 | 3/2009 | Sakurai et al. |
| 8,514,916 | B2 | 8/2013 | Bishop |
| 2001/0036228 | A1 | 11/2001 | Skafidas et al. |
| 2005/0243681 | A1* | 11/2005 | Yen .............................. 369/59.15 |
| 2010/0054315 | A1* | 3/2010 | Huang et al. ................... 375/222 |
| 2011/0292974 | A1 | 12/2011 | Lamba et al. |

FOREIGN PATENT DOCUMENTS

| TW | I220611 B | 8/2004 |
| TW | 201108675 A | 3/2011 |
| TW | 201308917 A | 2/2013 |

OTHER PUBLICATIONS

U.S. Appl. No. 14/326,895, Realtek Semiconductor Corp.
Taiwan Patent Office, Office Action, Patent Application Serial No. TW102129205, Apr. 15, 2015, Taiwan.
Taiwan Patent Office, Office Action, Patent Application Serial No. TW102146869, Apr. 27, 2015, Taiwan.

* cited by examiner

*Primary Examiner* — Leon-Viet Nguyen
(74) *Attorney, Agent, or Firm* — Rabin & Berdo, P.C.

(57) ABSTRACT

A method for controlling amplification factor of a receiver device includes: detecting a first variation of an equivalent length of a cable, detecting a second variation of amplification factor of a digital automatic gain controller (DAGC), determining a first update value of amplification factor of an analog automatic gain controller (AAGC) according to the first variation and the second variation, calculating a tuning ratio of the first update value to a current value of the amplification factor of the AAGC, calculating a second update value of the amplification factor of the DAGC according to the tuning ratio, updating a set value of the amplification factor of the AAGC according to the first update value, and updating a set value of the amplification factor of the DAGC according to the second update value.

12 Claims, 5 Drawing Sheets ical converter (ADC).

RECEIVER DEVICE AND METHOD FOR CONTROLLING AMPLIFICATION FACTOR THEREOF

CROSS-REFERENCES TO RELATED APPLICATIONS

This non-provisional application claims priority under 35 U.S.C. §119(a) on Patent Application No. 102146869 filed in Taiwan, R.O.C. on Dec. 18, 2013, the entire contents of which are hereby incorporated by reference.

BACKGROUND

1. Technical Field

The present invention relates to technologies of parameter tuning for a communication network system, and more particularly, to a receiver device and a method for controlling amplification factor thereof, which are applicable to communication network systems.

2. Related Art

In a receiver, gain of a programmable gain amplifier (PGA) no longer changes after being determined in a start-up program. However, environmental changes may cause variations of related parameters, thereby resulting in that a clipping phenomenon occurs in an output signal of an analog-to-digital converter (ADC).

For example, in an Ethernet system, for the same cable at different temperature ranging from −40° C. to 125° C., an equivalent length converted for an insertion loss of a signal measured by the cable may approximately change from 10 meters to more than 100 meters. When an influence of an environment temperature on the cable causes dramatic changes in the insertion loss, a peak-to-average power ratio (PAPR) of the signal may change accordingly, thus resulting in occurrence of the clipping phenomenon.

SUMMARY

In one embodiment, a method for controlling amplification factor of a receiver device includes: detecting a first variation of an equivalent length of a cable, detecting a second variation of amplification factor of a digital automatic gain controller (DAGC), determining a first update value of amplification factor of an analog automatic gain controller (AAGC) according to the first variation and the second variation, calculating a tuning ratio of the first update value to a current value of the amplification factor of the AAGC, calculating a second update value of the amplification factor of the DAGC according to the tuning ratio, updating a set value of the amplification factor of the AAGC according to the first update value, and updating a set value of the amplification factor of the DAGC according to the second update value.

In one embodiment, a receiver device includes a front-end receiving circuit, a feed-forward equalizer (FFE), an add circuit, a DAGC, a feedback equalizer (FBE), a channel estimator, and a control unit.

The front-end receiving circuit has an AAGC. The FFE is electrically connected to the front-end receiving circuit. The add circuit is electrically connected to the FFE. The DAGC is electrically connected between the FFE and the add circuit. The FBE is electrically connected to the add circuit. The channel estimator is used for estimating an equivalent length of a cable. The control unit is electrically connected to the AAGC, the DAGC and the channel estimator, and is used for determining a first update value of amplification factor of the AAGC according to a variation of the equivalent length and a variation of amplification factor of the DAGC, determining a second update value of the amplification factor of the DAGC according to a tuning ratio of the first update value to a current value of the amplification factor of the AAGC and updating set values of the amplification factor of the AAGC and the amplification factor of the DAGC according to the first update value and the second update value respectively.

In sum, the receiver device and the method for controlling amplification factor thereof according to the present invention are applicable to communication network systems, which can monitor changes in an environment temperature and adaptively tune amplification factor of an automatic gain controller (AGC), so as to accelerate system convergence and improve signal quality, thereby avoiding system link down and enhance system performance.

DETAILED DESCRIPTION

Figure 1:
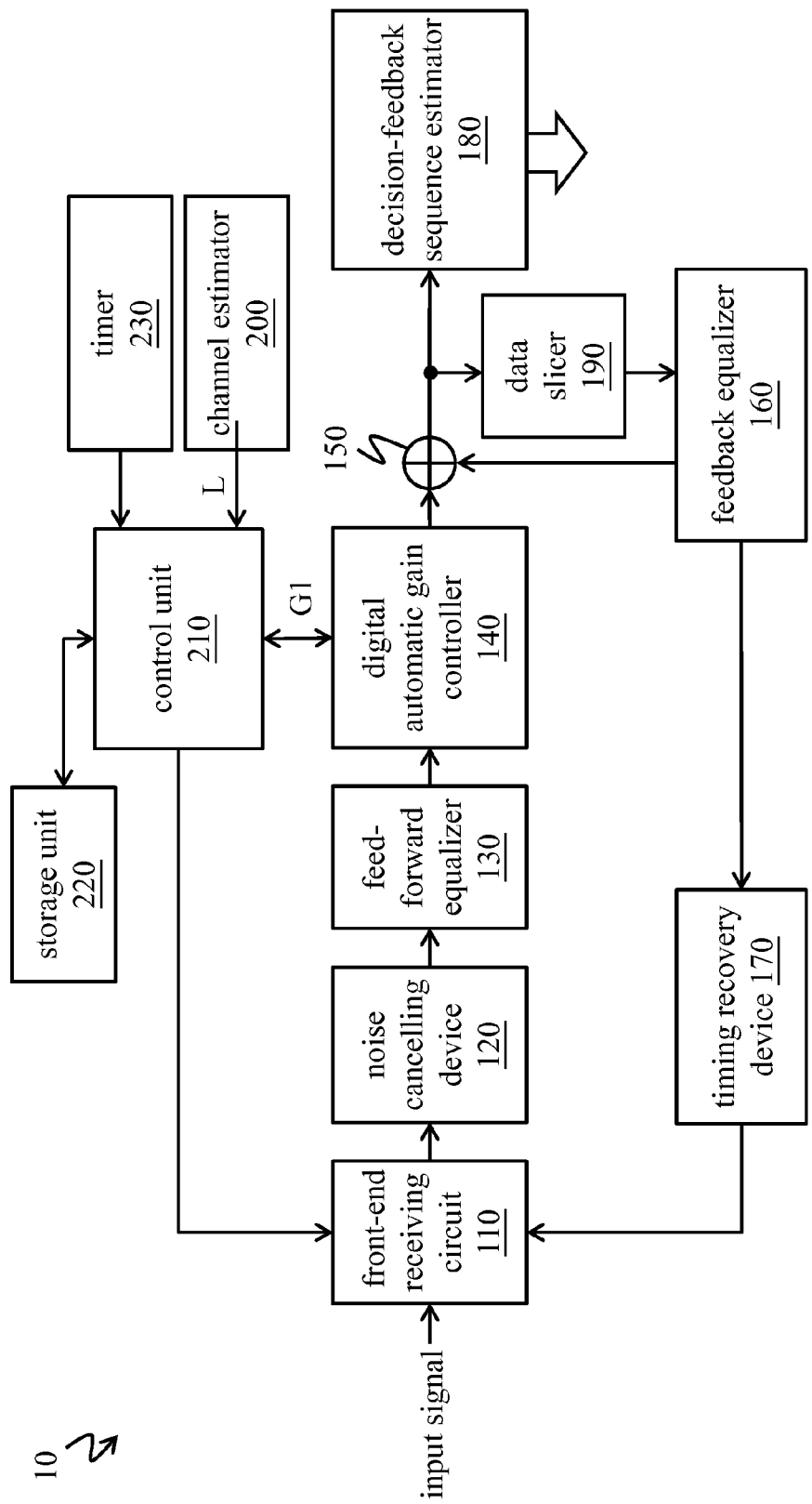
FIG. 1 is a schematic outline diagram of a receiver device according to one embodiment of the present invention.

FIG. 1 is a schematic outline diagram of a receiver device according to one embodiment of the present invention. The receiver device 10 is applicable to a communication network system. Herein, the communication network system may be, for example but is not limited to, an Ethernet system.

Referring to FIG. 1, the receiver device 10 includes a front-end receiving circuit 110, a noise cancelling device 120, an feed-forward equalizer (FFE) 130, a digital automatic gain controller (DAGC) 140, an add circuit 150, an feedback equalizer (FBE) 160, a timing recovery device 170, a decision-feedback sequence estimator (DFSE) 180, a data slicer 190, a channel estimator 200, and a control unit 210.

The front-end receiving circuit 110, the noise cancelling device 120, the FFE 130, the DAGC 140, the add circuit 150, and the DFSE 180 are electrically connected in sequence (connected in series). In other words, the noise cancelling device 120 is electrically connected between the front-end receiving circuit 110 and the FFE 130, and the DAGC 140 is electrically connected between the FFE 130 and the add circuit 150.

The FBE 160 is electrically connected to the add circuit 150, and the timing recovery device 170 is electrically connected between the front-end receiving circuit 110 and the FBE 160. Herein, two input ends of the add circuit 150 are respectively electrically connected to the FFE 130 and the FBE 160, and an output end of the add circuit 150 is electrically connected to the DFSE 180. The data slicer 190 is electrically connected between the add circuit 150 and the FBE 160.

The control unit 210 is electrically connected to the front-end receiving circuit 110, the DAGC 140, and the channel estimator 200.

The front-end receiving circuit 110 is used for receiving a remotely transmitted input signal and converting the input signal into a digital signal. The noise cancelling device 120 is used for cancelling near-end interference in the signal. The FFE 130 is used for cancelling a precursor component before inter-symbol interference (ISI) in the signal. The add circuit 150 is used for cancelling remote interference in digital input signals, passing through near-end interference cancellation, timing recovery and channel equalization, of other near-end receivers. The FBE 160 is used for cancelling a postcursor component after ISI. The timing recovery device 170 is used for executing signal timing recovery, so as to synchronize frequency and phase of a clock signal at a receiving end with frequency and phase of a clock signal at a transmitting end. The DFSE 180 is used for performing decoding and cancelling a postcursor component of ISI in the signal. The channel estimator 200 is used for estimating a length (that is, an equivalent length L of a cable coupled between the master/slave sending and receiving devices) of a channel between master/slave sending and receiving devices, so as to preset and update parameters of each element, so as to accelerate system convergence and enhance signal quality.

Figure 2:
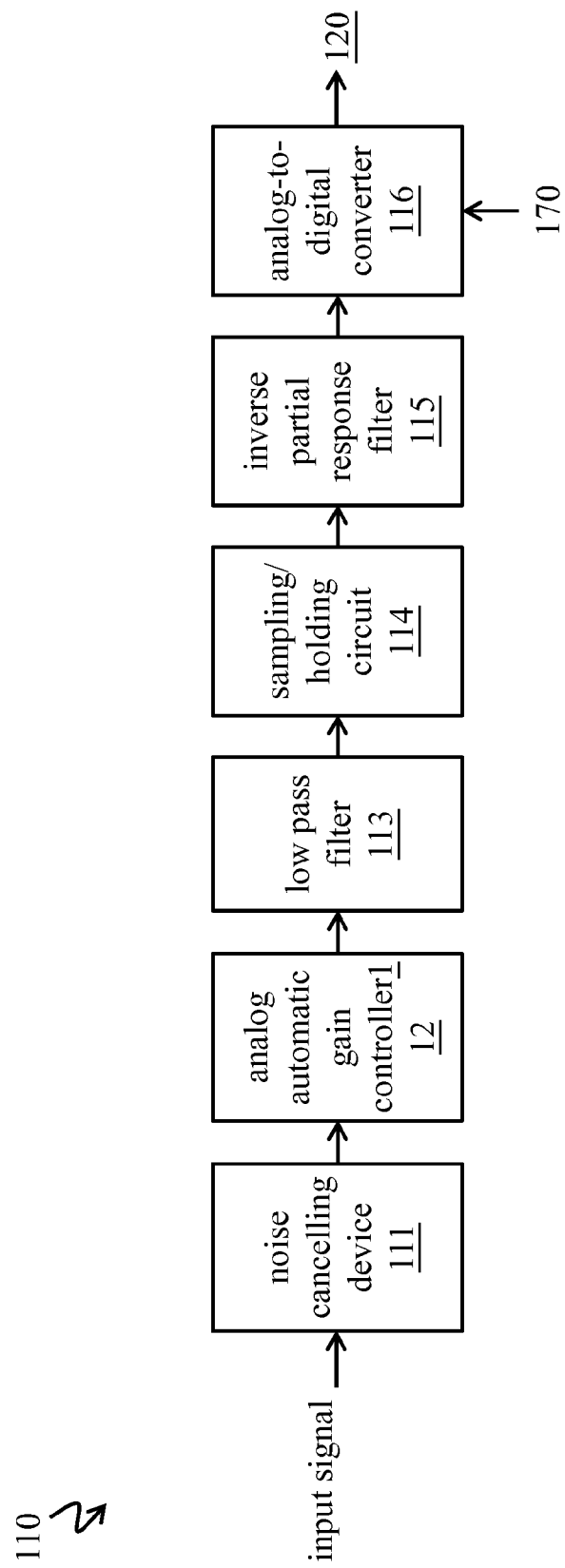
FIG. 2 is a schematic outline diagram of one embodiment of a front-end receiving circuit in FIG. 1.

Basically, the architecture and operation of the front-end receiving circuit 110 are known in this field, for example, referring to FIG. 2, in some embodiments, the front-end receiving circuit 110 may include: a noise cancelling device 111, an analog automatic gain controller (AAGC) 112, a low pass filter (LPF) 113, a sampling/holding circuit (S/H circuit) 114, an inverse partial response (IPR) filter 115 and an analog-to-digital converter (ADC) 116.

The noise cancelling device 111, the AAGC 112, the LPF 113, the S/H circuit 114, the IPR filter 115, and the ADC 116 as well as the noise cancelling device 120 are electrically connected in sequence (connected in series). The timing recovery device 170 is electrically connected between the ADC 116 and the FBE 160.

After the input signal is received by the noise cancelling device 111, the input signal is sequentially processed by the noise cancelling device 111, the AAGC 112, the LPF 113, the S/H circuit 114, the IPR filter 115 and the ADC 116 and then is output to the noise cancelling device 120.

Basically, architecture and operation of the noise cancelling device 120 are known in this field, for example, in some embodiments, the noise cancelling device 120 may include an echo canceller, multiple near-end crosstalk cancellers (NEXT cancellers) and an adder. The echo canceller and the NEXT cancellers are electrically connected to the other input end of the adder. An output end of the adder is electrically connected to the FFE 130.

Basically, a method for estimating an equivalent length L by the channel estimator 200 is known in this field, for example, the estimating method may be, for example, performing estimation according to a slope of a received signal in a transition period, performing estimation by measuring received signal energy, performing estimation by using a channel response of 6 MHz and 43 MHz proposed by Israel Greiss, performing estimation by using simplified discrete fourier transform (DFT) based on Israel Greiss's theory (for example, Chinese Patent No. TWI2205611), or performing estimation by using channel samples of the FEB 130 and the FFE 160 (for example, Chinese Patent Application No. 102129205), which is not limited herein.

In some embodiments, the DAGC 140 and the AAGC 112 can be implemented with a programmable gain amplifier (PGA) separately.

Generally, in a start-up program of the receiver device 10, the control unit 210 may preset element parameters of each element. In the present invention, in the operation process (after completion of the start-up program) of the receiver device 10, the control unit 210 further tunes amplification factor of an AGC according to changes in the environment temperature.

Figure 3:
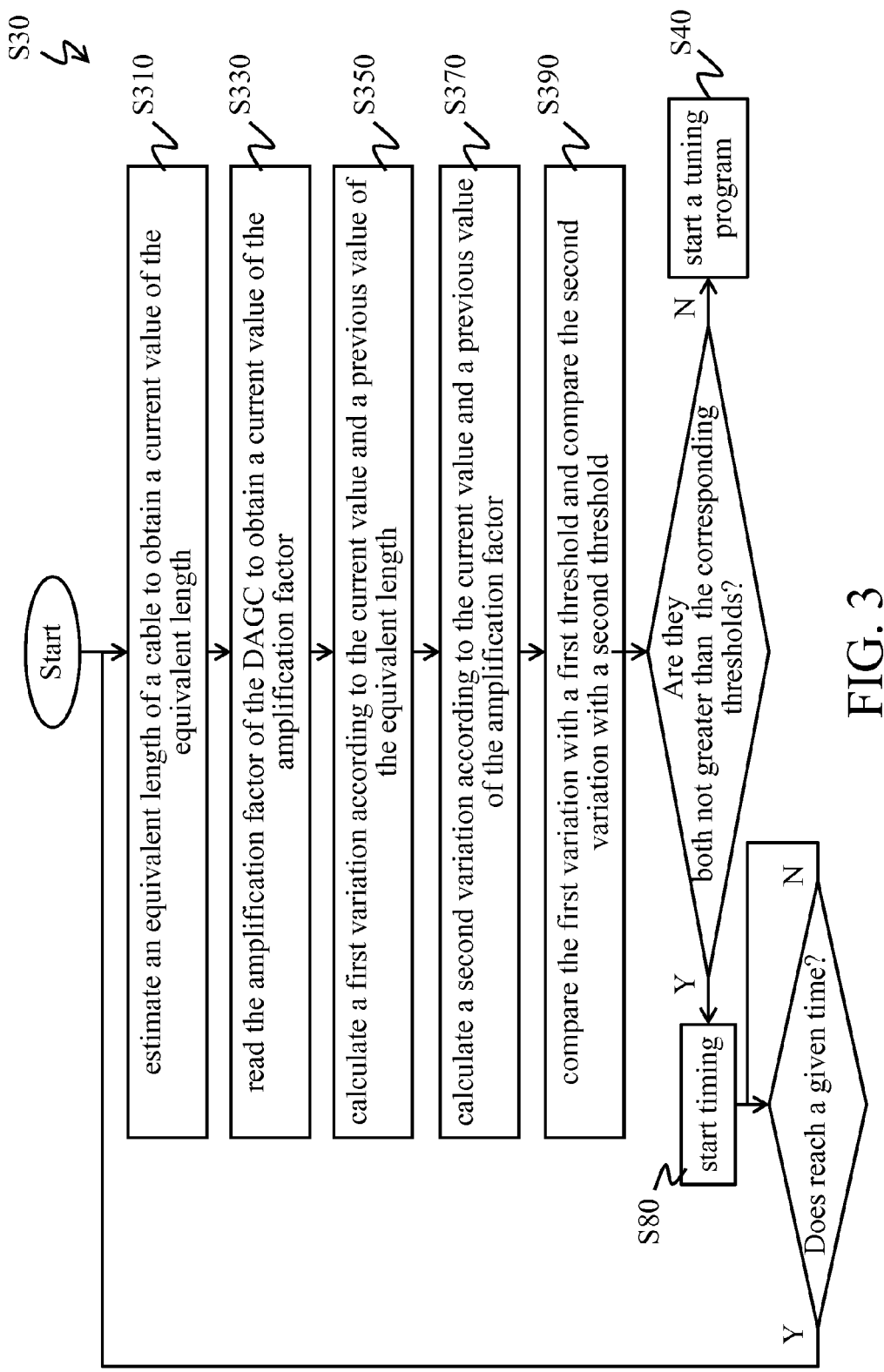
FIG. 3 to FIG. 5 are flow charts of a method for controlling amplification factor of a receiver device according to one embodiment of the present invention.

Referring to FIG. 3, the control unit 210 executes a temperature monitoring program (Step S30), to detect changes in the environment temperature by detecting a variation (hereinafter referred to as a first variation) of an equivalent length L and a variation (hereinafter referred to as a second variation) of amplification factor G1 of the DAGC 140.

Herein, the control unit 210 controls the channel estimator 200 to estimate an equivalent length L of a cable to obtain the estimated equivalent length L (that is, a current value) (Step S310), and reads the amplification factor G1 (that is, a current value) of the DAGC 140 (Step S330).

Afterwards, the control unit 210 calculates a first variation according to a current value of the obtained equivalent length L and a previous value obtained previously (that is, a previously estimated equivalent length L), that is, calculates a difference between a current value and a previous value of the equivalent length L (Step S350).

Moreover, the control unit 210 calculates a second variation according to a current value of the obtained amplification factor G1 and a previous value obtained previously (that is, previously read amplification factor G1), that is, calculates a difference between a current value and a previous value of the amplification factor G1 (Step S370).

The control unit 210 can be electrically connected to a storage unit 220. Each time the current values of the equivalent length L and the amplification factor G1 are obtained, the control unit 210 may store the obtained current values of the equivalent length L and the amplification factor G1 in the storage unit 220, to serve as previous values for calculating change quantities next time.

The control unit 210 compares the first variation with a first threshold and compares the second variation with a second threshold, to determine whether the environment temperature changes dramatically (Step S390). The first threshold and the second threshold are preset given values. For example, when the receiver device 10 leaves the factory, the first threshold and the second threshold are set as firmware or software and are stored in the storage unit 220 of the receiver device 10.

When one of the first variation and the second variation is greater than the corresponding threshold, or they are both greater than their corresponding thresholds, the control unit 210 determines that the environment temperature changes dramatically and starts a tuning program (Step S40).

When the first variation is not greater than the first threshold and the second variation is not greater than the second threshold (that is, they are both not greater than their corresponding thresholds), the control unit 210 determines that the environment temperature does not change dramatically.

Figure 4:
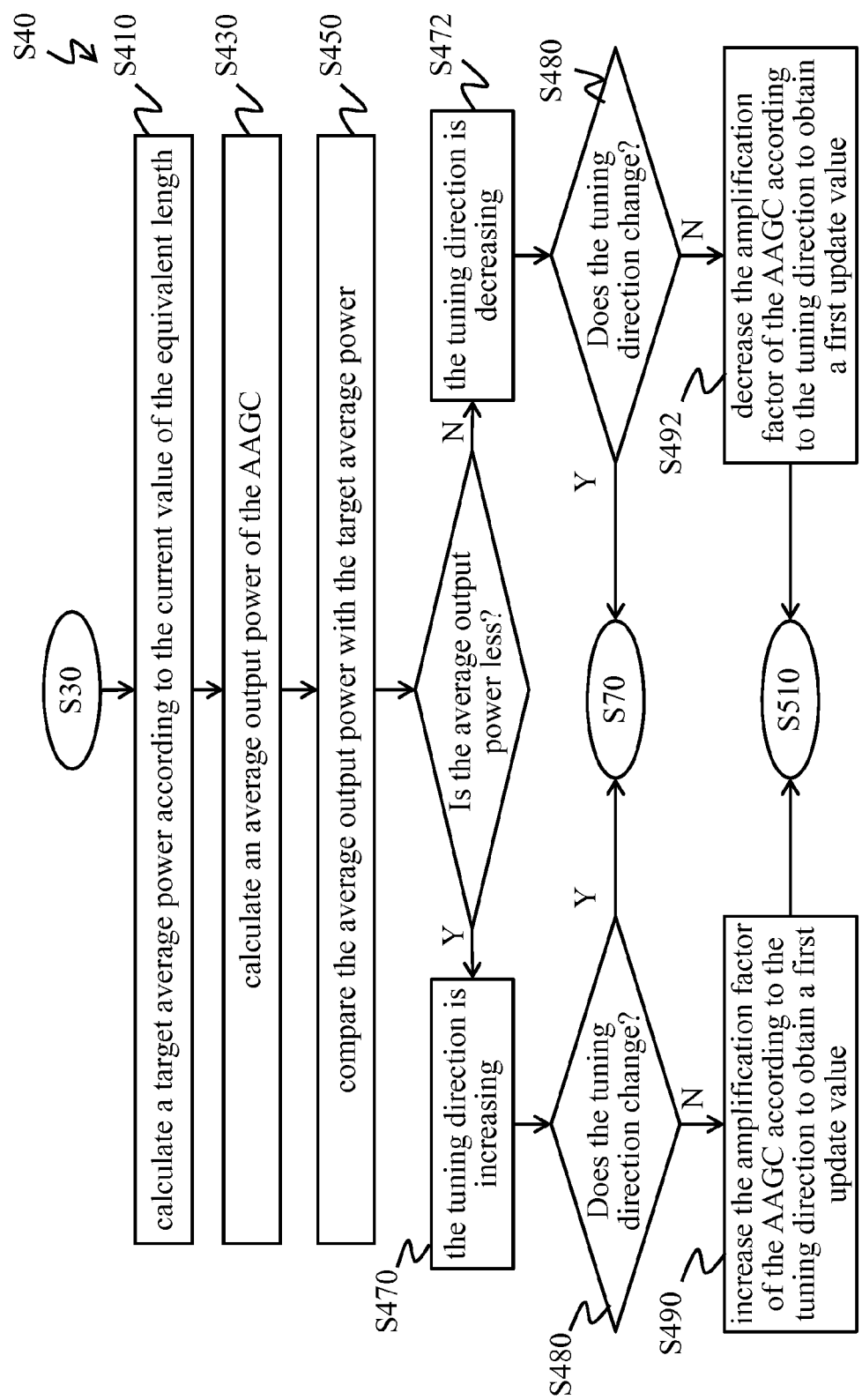
Figure 5:
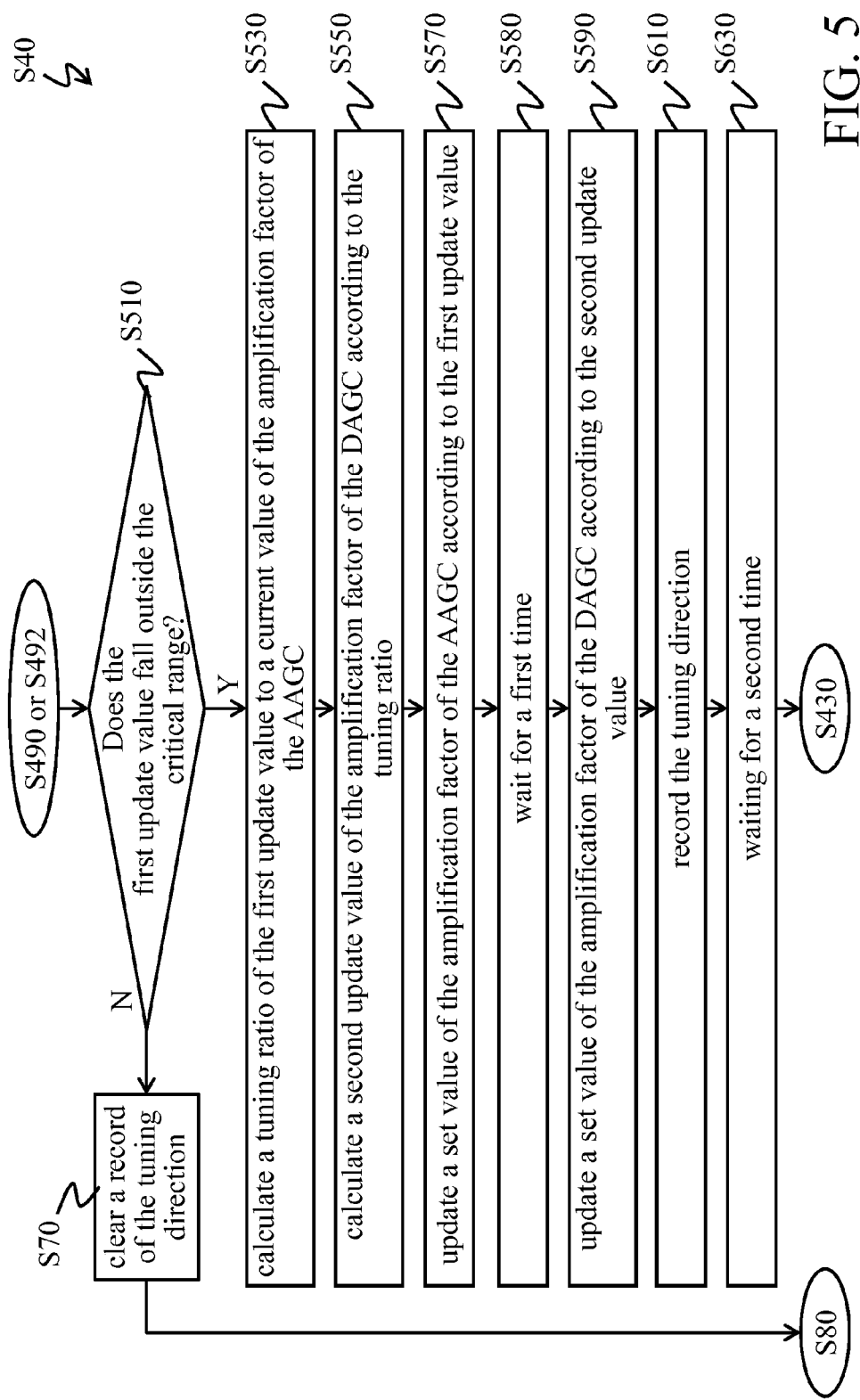

Referring to FIG. 4 and FIG. 5, when determining that the environment temperature dramatically changes, the control unit 210 executes the tuning program S40, so as to reset amplification factor of an AGC.

Herein, the control unit 210 calculates target average power according to the current value of the equivalent length L (Step S410).

Moreover, the control unit 210 calculates average output power of the AAGC 212 (Step S430).

Then, the control unit 210 compares the average output power with the target average power to judge a tuning direction (increase or decrease) of amplification factor G2 of the AAGC 212 (Step S450).

When the average output power is less than the target average power, the control unit 210 determines that the tuning direction is increasing amplification factor (hereinafter marked as G2) (Step S470), and increases gears of the amplification factor G2 of the AAGC 212 according to the tuning direction to obtain an update value (hereinafter referred to as a first update value) of the amplification factor G2 of the AAGC 212 (Step S490).

When the average output power is not less than the target average power, the control unit 210 determines that the tuning direction is decreasing the amplification factor G2 (Step S472), and decreases the gears of the amplification factor G2 of the AAGC 212 according to the tuning direction to obtain the first update value (Step S492).

Then, the control unit 210 compares the obtained first update value with a critical range (a maximum value and a minimum value) of the amplification factor G2 (Step S510), where the critical range is a preset given value. For example, when the receiver device 10 leaves the factory, the critical range is set as firmware or software and is stored in the storage unit 220 of the receiver device 10.

When the first update value falls within the critical range (that is, between a maximum value and a minimum value), the control unit 210 calculates a tuning ratio of the obtained first update value to a current value of the amplification factor G2 of the AAGC 212 (Step S530). For example, suppose the current value is Gear 3 (that is, the signal is amplified by 0.2) and the first update value is Gear 4 (that is, the signal is amplified by 0.3), the tuning ratio is 1.5 (=0.3/0.2).

The control unit 210 calculates an update value (hereinafter referred to as a second update value) of the amplification factor G1 of the DAGC 140 according to the tuning ratio (Step S550). For example, suppose the tuning ratio is 1.5, the second update value is equal to a current value of the amplification factor G1/1.5.

The control unit 210 updates a set value of the amplification factor G2 of the AAGC 212 according to the first update value (Step S570). In other words, the control unit 210 substitutes the first update value into the AAGC 212 to serve as a set value of the amplification factor G2.

Then, the control unit 210 updates a set value of the amplification factor G1 of the DAGC 140 according to the second update value (Step S590). In other words, the control unit 210 substitutes the second update value into the DAGC 140 to serve as a set value of the amplification factor G1.

Herein, the control unit 210 can, after performing Step S570, first wait for a given time (hereinafter referred to as a first time) (Step S580), and then perform Step S590, to ensure data continuity. In other words, the amplification factor G2 of the AAGC 212 and the amplification factor G1 of the DAGC 140 are not updated at the same time, and instead, their update times have a delay of a first time.

The first time corresponds to the number of elements connected in series between the AAGC and the DAGC. In other words, the first time is a time required for outputting the same data from the AAGC to the DAGC.

Herein, the control unit 210 may record the tuning direction (for example, store it in the storage unit 220) (Step S610).

Moreover, after waiting for a given time (hereinafter referred to as a second time) (Step S630) to converge the system, the control unit 210 re-executes the tuning program S40. Herein, in Step S410, the control unit 210 may record the calculated target average power (for example, store it in the storage unit 220), and re-calculation is unnecessary in the case of re-execution. In other words, after system convergence, the control unit 210 returns to Step S430, to re-execute Step S430 to Step S630.

Herein, the control unit 210 can determine whether to end the tuning program by detecting whether the tuning direction changes (Step S40). In other words, after obtaining the tuning direction (Step S470 or Step S472), the control unit 210 first compares the obtained tuning direction with the previously recorded tuning direction to determine whether the tuning direction changes (Step S480).

If the tuning direction does not change, the control unit 210 performs Step S490 or Step S492 subsequently.

If the tuning direction changes or the first update value falls outside the critical range (that is, greater than the maximum value or less than the minimum value), the control unit 210 ends the tuning program (Step S40).

Before the ending, the control unit 210 may clear a record of the tuning direction (that is, clear the tuning direction stored in the storage unit 220) (Step S70).

In some embodiments, the temperature monitoring program may be a background program. Moreover, the control unit 210 may start execution of the temperature monitoring program at an interval of a given time (hereinafter referred to as a third time) (Step S30).

Herein, the waiting for the first time, the second time, and the third time can be implemented with a timer. In some embodiments, the control unit 210 may be electrically connected to one or more timers 230. When it is necessary to wait, the control unit 210 starts the timer 230 to measure the time. When timing of the timer 230 reaches a given time, the control unit 210 is then triggered to perform the following steps.

For example, when the control unit 210 completes the start-up program, and determines that the environment temperature does not change dramatically or ends the tuning program S40, the control unit 210 starts the timer 230 to measure the time (Step S80). When timing of the timer 230 reaches the third time, the control unit 210 is triggered to start execution of the temperature monitoring program (Step S30).

In some embodiments, the control unit 210 and the channel estimator 200 may be implemented with one or more processing elements. Herein, the processing element may be, for example, a microcontroller (MCU), an embedded controller, a microprocessor (MPU), an application specific integrated circuit (ASIC), or the like, which is not limited herein.

For example, it is assumed that the control unit 210 may be an MPU and an MCU. The temperature monitoring program and the tuning program may be work of the MPU.

The temperature monitoring program may be a background program, and controls a tuning flag. The tuning flag can be stored in the storage unit 220. When it is determined that the environment temperature changes dramatically, the temperature monitoring program may set the tuning flag as 1. When it is determined that the environment temperature does not change dramatically, the temperature monitoring program maintains the tuning flag as 0.

In a data mode, the MCU may continuously check the tuning flag. When finding that the tuning flag is 1, the MCU calls the tuning program so that the MCU starts execution of the tuning program (Step S40) and suspends the temperature monitoring program.

In an energy-sufficient Ethernet mode (EEE mode), when finding that the tuning flag is 1, the MCU may return from the EEE mode to the data mode, and call the tuning program in the data mode.

The storage unit 220 may be implemented with one or more storage elements. Herein, the storage element may be, for example, a memory or a register, which is not limited herein. The timer 230 may be, for example, an interrupt timer, which is not limited herein.

It should be understood that, a sequence in which steps are described in the embodiments is not intended to limit the order of execution thereof, and within a reasonable range, the order of execution of the steps can be arbitrarily varied. For example, it is only necessary to perform Step S310 before Step S330, and there is no demand for a sequence among Step S310, Step S320 and Step S340; likewise, it is only necessary to perform Step S330 between Step S310 and Step S350, and there is no demand for a sequence among Step S330, Step S320 and Step S340.

In sum, the receiver device and the method for controlling amplification factor thereof according to the present invention are applied to communication network systems, which can monitor changes in the environment temperature and adaptively tune amplification factor of an AGC, so as to accelerate system convergence and improve signal quality, thereby avoiding system link down and enhance system performance.

While the present invention has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method for controlling amplification factor of a receiver device, comprising:
   detecting a first variation of an equivalent length of a cable;
   detecting a second variation of an amplification factor of a digital automatic gain controller (DAGC);
   determining a first update value of an amplification factor of an analog automatic gain controller (AAGC) according to the first variation and the second variation;
   calculating a tuning ratio of the first update value to a current value of the amplification factor of the AAGC;
   calculating a second update value of the amplification factor of the DAGC according to the tuning ratio;
   updating a set value of the amplification factor of the AAGC based on the first update value; and
   updating a set value of the amplification factor of the DAGC based on the second update value.

2. The method for controlling amplification factor of a receiver device according to claim 1, wherein the detecting steps are performed by a background program.

3. The method for controlling amplification factor of a receiver device according to claim 2, wherein the background program is triggered by a timer.

4. The method for controlling amplification factor of a receiver device according to claim 1, wherein the determining step comprises:
   comparing the first variation with a first threshold;
   comparing the second variation with a second threshold;
   when the first variation is greater than the first threshold, tuning the amplification factor of the AAGC according to the equivalent length and an average output power of the AAGC to obtain the first update value;
   when the second variation is greater than the second threshold, tuning the amplification factor of the AAGC according to the equivalent length and the average output power of the AAGC to obtain the first update value; and
   when the first variation is not greater than the first threshold and the second variation is not greater than the second threshold, maintaining the amplification factor of the AAGC.

5. The method for controlling amplification factor of a receiver device according to claim 4, wherein each the tuning step comprises:
   calculating a target average power according to the equivalent length;
   calculating the average output power of the AAGC; and
   increasing or decreasing, according to the target average power and the average output power, the amplification factor of the AAGC to obtain the first update value.

6. The method for controlling amplification factor of a receiver device according to claim 1, wherein the updating step of the DAGC is performed after the updating step of the AAGC is performed, and the updating steps are apart at a given time.

7. The method for controlling amplification factor of a receiver device according to claim 6, wherein the given time corresponds to the number of elements connected in series between the AAGC and the DAGC.

8. A receiver device, comprising:
   a front-end receiving circuit, having an analog automatic gain controller (AAGC);
   a feed-forward equalizer (FFE), electrically connected to the front-end receiving circuit;
   an add circuit, electrically connected to the FFE;
   a digital automatic gain controller (DAGC), electrically connected between the FFE and the add circuit;
   a feedback equalizer (FBE), electrically connected to the add circuit;
   a channel estimator, for estimating an equivalent length of a cable; and
   a control unit, electrically connected to the AAGC, the DAGC, and the channel estimator, for determining a first update value of an amplification factor of the AAGC according to a variation of the equivalent length and a variation of an amplification factor of the DAGC, determining a second update value of the amplification factor of the DAGC according to a tuning ratio of the first update value to a current value of the amplification factor of the AAGC, and updating set values of the amplification factor of the AAGC and the amplification factor of the DAGC according to the first update value and the second update value respectively.

9. The receiver device according to claim 8, further comprising:
   an interrupt timer, for triggering the control unit to detect the variation of the equivalent length of the cable and the variation of the amplification factor of the DAGC by using a background program according to a given time.

10. The receiver device according to claim 8, wherein when the variation of the equivalent length is not greater than a first threshold and the variation of the amplification factor of the DAGC is not greater than a second threshold, the control unit maintains the amplification factor of the AAGC;
    otherwise, the control unit tunes the amplification factor of the AAGC according to the equivalent length and an average output power of the AAGC and tunes the amplification factor of the DAGC according to the tuning ratio.

11. The receiver device according to claim 8, wherein the control unit updates the DAGC after a given time after updating the AAGC.

12. The receiver device according to claim 11, wherein the given time corresponds to the number of elements connected in series between the AAGC and the DAGC.

* * * * *